United States Patent
Gkantsidis et al.

(10) Patent No.: US 11,831,333 B2
(45) Date of Patent: Nov. 28, 2023

(54) ENCODING FOR DATA RECOVERY IN STORAGE SYSTEMS

(71) Applicant: Microsoft Technology Licensing, LLC, Redmond, WA (US)

(72) Inventors: Christos Gkantsidis, Cambridge (GB); Antony Ian Taylor Rowstron, Cambridge (GB); Andromachi Chatzieleftheriou, Cambridge (GB); Richard John Black, Cambridge (GB); Austin N. Donnelly, Cambridge (GB); István Haller, Cambridge (GB)

(73) Assignee: Microsoft Technology Licensing, LLC., Redmond, WA (US)

( * ) Notice: Subject to any disclaimer, the term of this patent is extended or adjusted under 35 U.S.C. 154(b) by 0 days.

(21) Appl. No.: 17/790,493

(22) PCT Filed: Dec. 14, 2020

(86) PCT No.: PCT/US2020/064738
§ 371 (c)(1),
(2) Date: Jun. 30, 2022

(87) PCT Pub. No.: WO2021/141727
PCT Pub. Date: Jul. 15, 2021

(65) Prior Publication Data
US 2023/0053467 A1 Feb. 23, 2023

(30) Foreign Application Priority Data
Jan. 9, 2020 (EP) ..................... 20151051

(51) Int. Cl.
*H03M 13/13* (2006.01)
*H03M 13/00* (2006.01)

(52) U.S. Cl.
CPC ......... *H03M 13/13* (2013.01); *H03M 13/611* (2013.01)

(58) Field of Classification Search
CPC ..... H03M 13/13; H03M 13/611; H03M 13/00
See application file for complete search history.

(56) References Cited

U.S. PATENT DOCUMENTS

| 7,756,051 B2 | 7/2010 | Rodriguez et al. |
| 8,326,884 B2 | 12/2012 | Jurneke |

(Continued)

FOREIGN PATENT DOCUMENTS

| EP | 1612982 A2 | 1/2006 |
| EP | 2605140 A1 | 6/2013 |
| JP | S6345920 A | 2/1988 |

OTHER PUBLICATIONS

"Search Report Issued in European Patent Application No. 20151051.8", dated Jul. 10, 2020, 7 Pages.

(Continued)

*Primary Examiner* — Justin R Knapp
(74) *Attorney, Agent, or Firm* — Barta, Jones & Foley, PLLC (57) ABSTRACT

A method of reading from a storage medium to recover a group of information sectors, each comprising a respective information payload. The medium stores redundancy data comprising a plurality of separate redundancy codes for the group, each code being a linear sum of terms, each term in the sum being the information payload from a different respective one of the information sectors in the group weighted by a respective coefficient of a set of coefficients for the redundancy code. The method comprises, after the redundancy data has already been stored on the medium: identifying a set of k' information sectors to be recovered; selecting k' of the redundancy codes; determining a square matrix E of the k' information sectors by the k' sets of (Continued)

coefficients of the selected codes; determining a matrix D being a matrix inverse of E; and recovering the k' information payloads from the inverse matrix D.

20 Claims, 3 Drawing Sheets

(56) References Cited

U.S. PATENT DOCUMENTS

| | | | |
|---|---|---|---|
| 8,806,297 | B2 | 8/2014 | D'abreu et al. |
| 10,186,296 | B2 | 1/2019 | Burd et al. |
| 2006/0064557 | A1 | 3/2006 | Gold et al. |
| 2007/0299897 | A1* | 12/2007 | Reznik .................. H04N 19/61 708/409 |
| 2010/0238984 | A1* | 9/2010 | Sayana ................ H04B 7/0634 375/219 |
| 2012/0192037 | A1 | 7/2012 | Gibson et al. |
| 2017/0270963 | A1 | 9/2017 | Maeto |

OTHER PUBLICATIONS

Low, et al., "Packet Loss Recovery Codes Based on Vandermonde Matrices and Shift Operators", In IEEE International Symposium on Information Theory, Jul. 6, 2008, pp. 1058-1062.

Westall, et al., "An Introduction to Galois Fields and Reed-Solomon Coding", Retrieved from: https://people.cs.clemson.edu/~westall/851/rs-code.pdf, Oct. 4, 2010, 16 Pages.

"International Search Report and Written Opinion Issued in PCT Application No. PCT/US20/064738", dated Mar. 11, 2021, 11 Pages.

Plank, Jamess., "A Tutorial on Reed-Solomon Coding for Fault-Tolerance in RAID-like Systems", In Journal of Software Practice & Experience, vol. 27, Sep. 1, 1997, pp. 995-1012.

Schroeder, et al., "Understanding Latent Sector Errors and How to Protect Against them", In Journal of ACM Transactions on storage, vol. 6, Issue 3, Sep. 1, 2010, 14 Pages.

* cited by examiner

| $v_{1,1}$ | ... | $v_{1,m}$ | $r_{x,1,1}$ | ... | $r_{x,1,k'}$ |
|---|---|---|---|---|---|
| ... | ... | ... | ... | ... | ... |
| $v_{m,1}$ | ... | $v_{m,m}$ | $r_{x,m,1}$ | ... | $r_{x,m,k'}$ |
| $r_{y,1,1}$ | ... | $r_{y,1,1}$ | | | |
| ... | ... | ... | | | |
| $r_{y,k',1}$ | ... | $r_{y,k',m}$ | | | |

ENCODING FOR DATA RECOVERY IN STORAGE SYSTEMS

BACKGROUND

Most large scale practicable digital data storage media systems use redundancy to help correct from types of errors that are more likely to occur. These may be present within an individual sector of data, or across multiple sectors of data within a single media, or across multiple pieces of media. For example, within a single sector it is common for hard drives to use LDPC (low density parity check) as an error correcting method for small scale bit errors. Across media it is common to use RAID (redundant array of independent disks) to protect against failure of individual disks.

Methods and systems to recover from sector error within a single media are less frequently used and tend to be more primitive. For example, on a disk drive it is common to reserve a small portion of the media for spares, and to use one of these locations as a replacement if a particular sector's preassigned area is believed to be failing. This can be problematic if the spare area is too large or too small because it must be chosen in advance, and also it leads to unpredictability in latency of access. In another example, on tape based systems it is common for a read-after-write to check whether a write was successful, and if not an additional copy of the sector is written. This can be problematic because it leads to unpredictable capacity within the tape.

More complex and efficient schemes are impractical in normal storage systems because they must handle the case where data is rewritten, or where the total data to be written in the entire medium is not available simultaneously. Furthermore, they are usually rendered unnecessary by the need for a protection across multiple pieces of media, e.g., due to the relatively high failure rates of disk drives and tapes.

A WORM (write-once-read-many) storage systems is a form of storage where all the data is written once in one operation. Although classical optical media such as CDs and DVDs are both WORM and write all the data in one operation, they do not tend to use complex media-wide redundancy systems because of the need to supply data at fixed rate on read e.g. to the audio or video playout device, and/or the requirement to keep the playout device of exceptionally low cost in consumer scenarios.

Another known type of optical WORM storage uses quartz glass as the storage medium. Information is imprinted on the structure with the help of ultrafast lasers (typically femtosecond lasers). Such lasers have the capability to direct large amounts of energy in a very limited space, change the structure of the glass in that area in a controlled and permanent way, and, as a result, store information there. Some such systems enable storage of data over three dimensions of the medium, in which case the location of a given bit or symbol may be referred to as a voxel. Reading then works by using polarisation sensitive microscopy to shine light in a specific part of the glass, and infer the data written in that area by measuring the certain properties of the observed light.

SUMMARY

According to one aspect disclosed herein, there is provided a computer-implemented method of reading from a storage medium in order to recover a group of information sectors, each information sector comprising a respective information payload. The storage medium stores redundancy data comprising a plurality of separate redundancy codes for said group, each redundancy code being a linear sum of terms, each term in the sum being the information payload from a different respective one of the information sectors in said group weighted by a respective coefficient of a set of coefficients for the redundancy code. The method comprises, after the redundancy data has already been stored on the storage medium, performing a decoding process comprising: identifying a set of k' information sectors from said group from which the respective information payloads are to be recovered based on the redundancy data; selecting k' of the redundancy codes; determining a square matrix E in which each matrix column comprises the respective coefficients of a different one of the k' information sectors, and each matrix row comprises the set of coefficients of a different one of the k' redundancy codes, or vice versa; determining a matrix D being a matrix inverse of E; and recovering the k' information payloads by computing: $v_i = \Sigma_j (d_{i,j} \cdot r_j)$, where $v_i$ is the information payload, i is an index denoting the respective information sector, and j is an index denoting each redundancy code $r_j$, and where $d_{i,j}$ are the matrix elements of the D, and $\Sigma_j$ is the sum over the k' redundancy codes, the computation being performed for i of each of the k' information sectors.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

The following describes network storage and recovery methods that have a particular, but not exclusive, application to WORM (write-once-read-many) storage systems such as quartz glass, where all the data is written at once in one operation, and where the medium is exceptionally durable. This permits a superior in-media redundancy error-recovery method and system. Embodiments may be described in relation to a quartz glass medium, but the disclosed methods can also be applied to any WORM medium where all the data to be written is available to be processed at the time of writing.

More generally still, the disclosed methods can be used with any medium including more conventional optical discs, magnetic media or electronic storage media. However, in practice these tend to be used for reading and writing of small portions of data in real-time or on-the-fly. For example, although classical optical media such as CDs and DVDs are both WORM and write all the data in one operation, they do not tend to use complex media-wide redundancy systems because of the need to supply data at fixed rate on read, e.g. to the audio or video playout device, and/or the requirement to keep the playout device of exceptionally low cost in consumer scenarios. The presently disclosed methods have a particular, but not exclusive, applicability to long-term storage systems, such as in archival storage systems, where it is acceptable to write relatively large amounts of data at once, and to read a relatively large amount of data at once in the case where recovery is needed. The disclosed methods could be used for example in a quartz glass data repository, and/or in cloud based archival systems.

The encoding method divides the data to be stored into sectors, which may be referred to as content sectors or information sectors. The information sectors are used to construct random linear combinations of the information in those sectors. These combinations may be referred to as recovery sectors or redundancy sectors. Both the information sectors and redundancy sectors may be stored on the storage medium. Alternatively the redundancy information could be made known to the reader via a separate medium. Either way, during the reading process, a method is applied for determining which sectors have been read correctly, and which are missing. The correctly read redundancy sectors are then used to recover the missing information sectors by inverting the random linear combinations. This process is akin to inverting a system of linear equations.

As an optional optimization, the information sectors can be divided into groups, redundancy coding operation can be applied for each group independently. This approach reduces the computational overhead of the aforementioned coding with a minimal degradation in error-correcting performance. Alternatively all the sectors on the whole medium may be encoded as one group.

The sets of coefficients used for the linear combinations may be predetermined. As another optional extension, which increases the flexibility of the code, the coefficients may be stored with the encoded sectors. However, this would have a relatively large storage cost. Therefore instead, to reduce overhead, the coefficients may be generated from a deterministic pseudorandom process. Hence, it suffices to store the seed that initializes the random process, as well as the index of the random process that produced the coefficients.

Coding is a common technique to provide reliability, both in storage and networking applications. Codes differ in the way they combine the original content to construct encoded information. The differences aim to trade-off reliability performance, coding overhead, coding and decoding computation complexity, and other factors. The presently disclosed method is similar to a network coding technique disclosed in U.S. Pat. No. 7,756,051 for encoding data to be transmitted over a network for the purpose of content distribution, as opposed to storage. However, the existing network coding technique is "non-systematic", meaning the payload data itself is encoded by the same encoding schema that is adding the redundancy, and decoding is always required as matter of course in order to extract the payload information. Whereas in the presently disclosed method, the encoding is "systematic", meaning the payload remains unencoded by the encoding method being applied to add the redundancy (even if the payload happens to be encoded by some other orthogonal, lower layer encoding scheme, such as for compression and/or encryption purposes rather than redundancy). Instead the redundancy data is separate to the payload information, e.g. being appended in a separate redundancy sector, or even communicated over a separate medium. In the systematic case, the corresponding decoding method is only required in the event that an error needs to be recovered in the payload information, and not necessarily with every read.

Compared to other coding techniques, network coding offers very good reliability performance (i.e. can decode with high probability with modest storage overhead) for a wide range of failure scenarios, and also allows the construction of an arbitrary number of encoded sectors. To provide those benefits, it may sacrifice computational performance. The present disclosure extends the scope of an existing network coding type encoding scheme to include the application of storage.

The disclosed approach for constructing the error correction codes thus provides a reliable data recovery for applications such as archival storage, and can provide quantifiable reliability guarantees. In embodiments it also reduces the storage overhead compared to existing systems.

In embodiments, nearby storage elements (each storing an individual bit or other such elementary symbol of data) may be grouped together to define a sector. A sector typically stores a few tens of Kbytes of data, and are usually the same size. As with all storage systems, due to write and read imperfections, elements in a sector can be written or read with errors. To deal with that problem, redundant information is stored in each sector, which allows detection of errors in the sector, and usually correction of those errors. Additionally, an integrity check may be stored, in the form of a hash or checksum, in order to determine whether the aforementioned correction was successful. There are many known algorithms for determining integrity. Some of the bytes available in the sector may be reserved to store the integrity check information. After reading all the elements in a sector and checking the integrity, it is then possible to determine whether the sector has been read correctly in its entirety (with very high probability), or whether there are errors in the sector. The presently disclosed decoding method may then recover the sectors that contain errors.

The approach comprises generating (and in embodiments storing in the medium) specially crafted codes which can be used to recover the erroneous sectors. In embodiments, these redundancy codes may be stored in their own redundancy sectors on the medium. Hence, some sectors may be reserved in the medium for storing special redundancy sectors instead of user data. To recover the missing user sectors, the redundancy sectors are combined with other user sectors that have been read correctly.

In one implementation, it is possible to use any redundancy sector to recover any user sector. In other words, all user data stored across the whole medium may be used to construct all redundancy sectors, and as a result, every redundancy sector can help in the recovery of every user sector. Even though this approach is possible, in practice it may be computationally impractical. As an optimization therefore, the user sectors may instead be divided in groups, and the encoding method constructs redundancy sectors that are group specific. In this case, recovery is only performed inside a given group, combining user sectors from a single group with redundancy sectors from the same group to recover missing user sectors (of that group). The size of those groups (the number of user and redundancy sectors) is a design parameter that depends on the expected sector read failure rate, the desired reliability goal, and other practical concerns.

Some example embodiments of the presently disclosed techniques are now discussed in more detail with reference to FIGS. 1 to 4.

Figure 1:
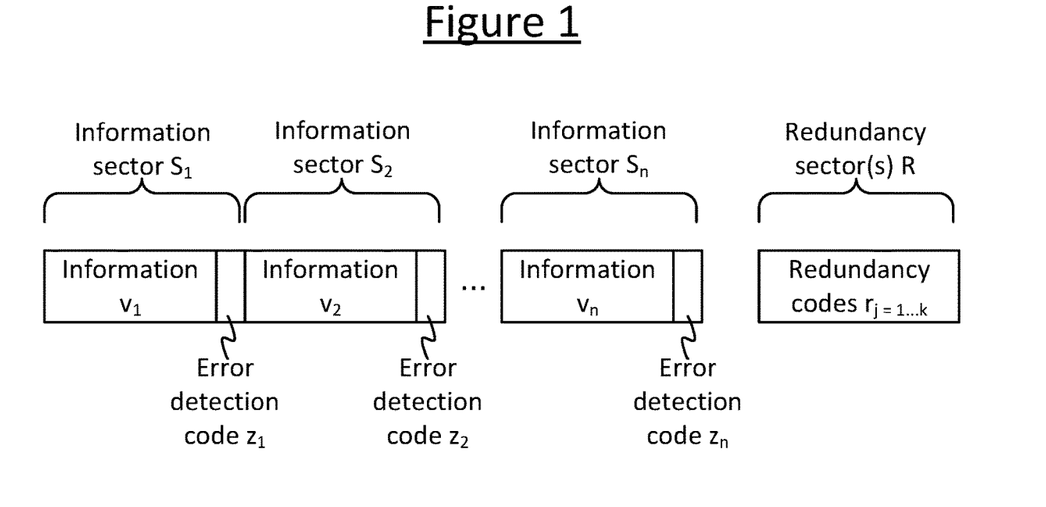
FIG. 1 is a schematic representation of a data storage scheme.

FIG. 1 shows a scheme for arranging data into sectors on a storage medium. The data is stored by a storing computer. The storage medium may be an integral part of the storing computer or may be an external or removable medium. The storing computer may comprise one or more computer units (in one or more housings) at one or more locations. The data can be read, and errors recovered, by a reading computer. The reading computer may be the same computer as the storing computer or a different computer, or in the case of being implemented over multiple computer units may share one or some of the same units. In the case of multiple computer units, suitable distributed computing techniques will, in themselves, be familiar to a person skilled in the art. The or each computer unit of the storing and reading computer comprises one or more processors on which the disclosed storing and reading methods are run, respectively. The or each processor may comprise one or more cores. Examples of such processors include general purpose CPUs (central processing units); and coprocessors, accelerator processors or application-specific processors such as a dedicated memory processor, or repurposed GPU (graphics processor), DSP (digital signal processor) or crypto processor, etc.

In embodiments the storage medium is a quartz glass based storage medium. However this is not limiting. More generally, the storage medium may be any WORM (write once, read many) medium, or a ROM (read only memory), or even a re-writeable (but non-volatile) memory. The difference between a ROM and a WORM is that a ROM is written in the factory whereas a WORM can be written once in the field by an end user (consumer). The storage medium may be an optical medium such as quartz glass or an optical disc (e.g. CD or DVD); a magnetic medium such as a hard disk drive, floppy disk or magnetic tape; or an electronic medium, e.g. a hard-wired ROM, EPROM (erasable programmable ROM), EEPROM (electrically erasable programmable ROM), or a flash memory or solid state drive. Other types of storage medium may also be familiar to a person skilled in the art, and most generally the disclosed methods are applicable to any type of computer-readable medium for storing data.

In embodiments, the storage medium may comprise a single, continuous piece of writeable material, e.g. a single piece of quartz glass, or a single magnetic disk, etc. Alternatively the medium may comprise more than one pieces of writeable material, e.g. multiple pieces of glass, or multiple magnetic disks, etc. In the latter case the disclosed scheme can provide redundancy across multiple separate pieces of writeable material ("platters") in addition to redundancy of a large number of sectors within a platter. This application space may be particularly important in archival storage, for example.

Whatever form the medium takes, the information to be stored is divided amongst a group of information sectors $S_i$, i=1 ... n. In the notation used herein i denotes an index of a respective information sector $S_i$ within the group, and there are a plural number n of information sectors in the group. For the purpose of notation the index i is represented as running from 1 to n to denote that it can take a value indicating any of the n information sectors. This does not necessarily imply that the actual digital parameter used by the reading or writing computer to index the sectors runs numerically from 1 to n (e.g. in practice this could run from 0 to n−1 in binary). It will be appreciated that this is just a convenient mathematical representation or notation.

The group of n information sectors could be all the information sectors on the medium (e.g. the glass, disc or tape etc.) or could be only one of multiple groups of information sectors on that medium. In the latter case, the following scheme could be applied to only one of the groups, or independently to each of some or all of the groups. The following describes the storage and encoding within a given group.

Each information sector $S_i$ represents a separate portion of data. Each information sector $S_i$ is stored in a different respective physical sector of the storage medium. In embodiments each of the physical sectors may be the same size as one another. In embodiments the information sectors stored on the physical sectors may each be the same size as one another. In embodiments the physical sectors within a group may be contiguous with one another, or may be interleaved with the sectors of one or more other groups. Each physical sector comprises a plurality of storage elements, each for storing an individual elementary symbol (e.g. bit) of data. E.g. in a 3D quartz glass medium these would be the individual voxels. In embodiments, the storage elements within a given physical sector may form a contiguous series or array of elements, e.g. a contiguous rectangle or rectangular cuboid of voxels. However this is not essential and the sectors could simply be logical sectors not tied to the underlying physical layout of the physical storage elements.

Each information sector $S_i$ comprises at least an information payload $v_i$, i.e. data content (user data). This is the actual data which the user wishes to store. In embodiments each information payload may comprise, and be processed as, as a vector of constituent information values. Hence the information payload $v_i$ may also be referred to herein as the information vector.

The reading computer will also require some mechanism to detect whether the information payload $v_i$ of each information sector $S_i$ has been read correctly. To implement this, a respective error detection code $z_i$ may be associated with each of the information payloads $v_i$. In embodiments this is stored in each individual information sector $S_i$ along with its respective information payload $v_i$, e.g. appended to the respective payload $v_i$. Alternatively however, it could in principle be stored elsewhere on the same medium, or even elsewhere on a different medium of the reading computer. Wherever stored, the error recovery code $z_i$ is a small piece of redundant data such as a parity bit or checksum that allows the reading computer to detect (though not necessarily correct) an error in the respective information payload $v_i$ upon reading the payload and error detection code. This could comprise an error that occurred upon originally writing the information payload $v_i$ to the medium, or an error that occurred due to deterioration on the medium at a time between writing and reading, or a read error that occurred in the reading process, or a combination of any two or more of these.

In addition to the information sectors $S_i$ and error detection codes $z_i$, a plurality of redundancy codes $r_j$, j=1 ... k, are also computed. These enable recovery of one or more of the information payloads $v_i$ in event that an error of any type (write, deterioration or read) is detected upon read, e.g. based on the error detection code(s) or even just a complete read failure. In embodiments each information payload may comprise, and be processed as, a vector of constituent elements. Hence a recovery code $r_j$ may also be referred to herein as a redundancy vector.

Note: the error detection codes $z_i$ are also redundant data, but they are not included for the purpose of error recovery, and in embodiments do not enable error recovery, or at most would only enable error recovery (if used for such) for information experiencing simpler or more limited errors. To distinguish over the error detection codes, the redundancy codes $r_j$ could also be referred to as error recovery codes.

In the notation used herein j denotes an index of a respective one of the redundancy codes (recovery codes) $r_j$ for a given group of information sectors $S_i$, and there are a plural number k of redundancy codes for the group. For the purpose of notation, the index j is represented as running from 1 to k to denote that it can take a value indicating any of the k redundancy codes. This does not necessarily imply that the actual digital parameter used by the reading or writing computer to index the redundancy codes $r_j$ runs numerically from 1 to k (e.g. in practice this could run from 0 to k−1 in binary). It will be appreciated that this is just a convenient mathematical representation or notation.

In embodiments, the set of redundancy codes $r_j$ is stored on the same storage medium as the information sectors $S_i$, in at least one separate redundancy sector R. This may be a separate physical sector of the storage medium. In some such embodiments each code is stored in a different respective redundancy sector $R_i$. In some embodiments each redundancy code $r_j$ may be the same size as each information vector $v_i$ or information sector. In embodiments each redundancy sector $R_i$ may be the same size as each information sector $S_i$. Alternatively, the size of each redundancy code $r_j$ may be different (e.g. smaller) than the size of an information vector $v_i$ or information sector $S_i$, and/or there may be more than once code stored per redundancy sector R. In further alternatives, it is not excluded that the redundancy codes are not stored in separate sectors and could be distributed amongst the information sectors $S_i$.

Note that there is not necessarily the same number or redundancy codes $r_j$ for a given group of information sectors $S_i$ as there are information sectors in that group (k is not necessarily equal to n), and there is not a one-to-one mapping between the redundancy codes $r_j$ and the information sectors $S_i$ of a given group. Rather, as will be discussed in more detail shortly, each redundancy code $r_j$ is a different linear combination of at least the information payloads $v_i$ of the n information sectors $S_i$ in the group. In general, the total number of redundancy codes k may be less than the number of data items n, or the same, or in embodiments the number of redundancy codes k can be also be larger than the number of data items n.

In addition, the coefficients $c_{j,i}$ used to compute the redundancy codes $r_j$ (see later) may be stored on the medium, e.g. in the redundancy sector(s) R, along with the codes themselves. In this case the reading computer will read the coefficients from the medium and use them to compute the redundancy codes $r_j$. Alternatively, the coefficients may be determined according to a predetermined deterministic process such as a pseudorandom process, and only an indication of the process used may be stored in the medium, e.g. again in the redundancy sector(s) R. In this case the reading computer will read the indication from the medium, use this to determine the process used for determining the coefficient, use this to determine the coefficients itself, and use these coefficients to compute the redundancy codes $r_j$. The indication may for example comprise a seed of the pseudorandom process. Optionally it may also comprise an indication of which of a plurality of available forms of algorithm was used as the predetermined process. Alternatively the form of the algorithm could be assumed by the reading computer.

In yet further variants, none of the redundancy codes $r_j$, nor coefficients $c_{j,i}$, nor any indication of the process for determining the coefficients, need be written to the storage medium itself. Instead any one of these could be communicated to the reading computer via a separate medium (e.g. communication channel). E.g. they could be published, or could be sent specifically to the reading computer, for example over a network or on a separate storage medium such as a dongle. In the case where the storing and reading computer are the same computer, the communication could simply comprise storing the codes, coefficients and/or indication locally on the computer in questions, e.g. on a local hard drive.

Figure 2:
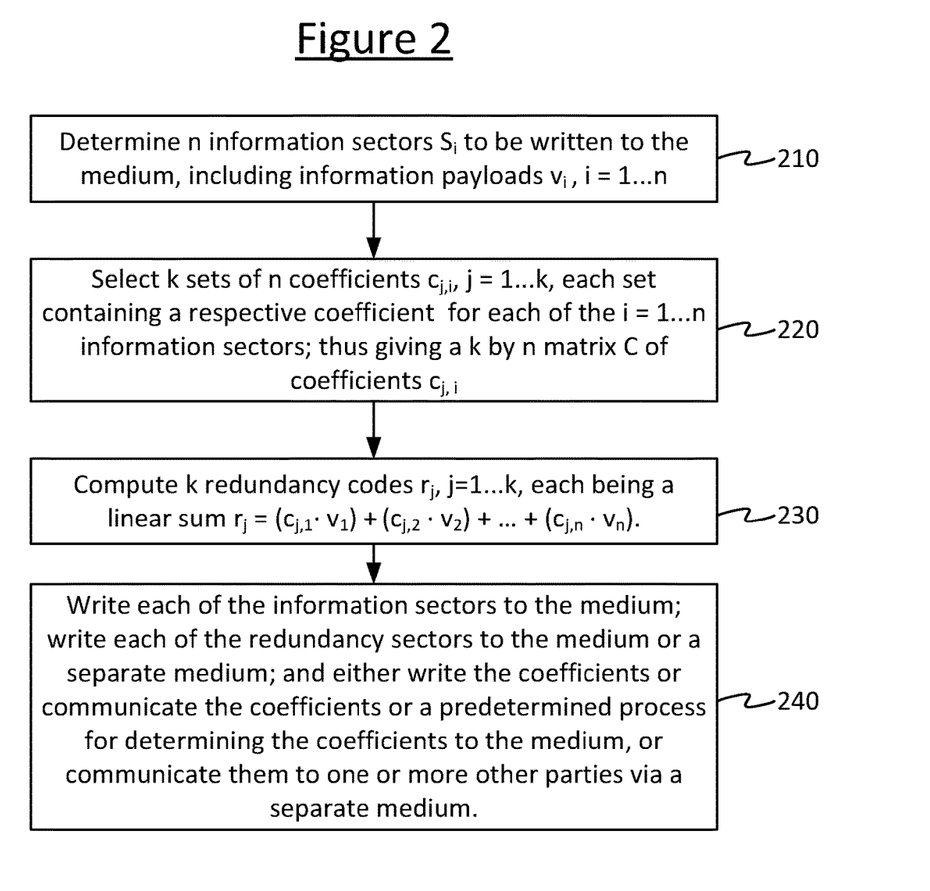
FIG. 2 is a flow chart of a method of storing data to a medium including redundancy data.

FIG. 2 shows an encoding method that may be applied at a storing computer, for storing the data in the form described in relation to FIG. 1 and determining the redundancy codes $r_j$. The method is performed by software stored in memory and run on at least one processor of the storing computer. The memory may comprise one or more memory units, which could for example comprise any of the types of medium discussed above in relation to the storage medium on which the information sectors $S_i$ are stored, and/or different types, e.g. RAM (random access memory), etc.; and which could be the same or separate units than said storage medium, or a combination thereof.

At step 210 the method determines a group of n information sectors $S_i$ that are to be written to the storage medium (e.g. the quartz glass), i=1 . . . n. This step comprises at least determining the n respective information payloads $v_i$, one for each sector $S_i$. This is the user information (i.e. content) that the method is used to store and protect with the redundancy codes. Step 210 may also comprise generating the respective error detection code $z_i$ (e.g. one or more checksum bytes) for each sector $S_i$. Alternatively these could be stored elsewhere on the medium or in principle even on a different medium, though this would make error detection slower.

Steps 220 to 230 then generate the redundancy codes, e.g. to be stored in the redundancy sector(s) R. The method combines the information bytes into k redundancy codes or codewords $r_j$, j=1 . . . k (for example a codeword can consist of 2 bytes). These may be described as random linear codes, or linearly independent codes, for reasons that will be explained shortly.

At step 220 the method selects coefficients for performing the linear combinations. To accommodate the possibility of errors in multiple of the information payloads $v_i$ per group, the method will generate multiple redundancy codes $r_1$, $r_2$, . . . , $r_k$. Hence at step 220 the method selects a different set of coefficients $c_{j,i}$ for each of the j=1 . . . k redundancy codes $r_j$ that are to be generated. Each set (each for a respective code $r_j$) comprises n non zero coefficients $c_{j,i}$, one for each of the i=1 . . . n information sectors $S_i$. These coefficients may for example be selected randomly. Together the sets may be described as a k by n matrix C of coefficients $c_{j,i}$, where j=1 . . . k and i=1 . . . n.

$$C = \begin{pmatrix} c_{1,1} & \cdots & c_{1,n} \\ \vdots & \ddots & \vdots \\ c_{k,1} & \cdots & c_{k,n} \end{pmatrix} \qquad (1)$$

Each row corresponds to a different set of coefficients for a different one of the k redundancy codes $r_j$, j=1 ... k. The k sets should be linearly independent of one another, or the probability of them being so when selected randomly should be within some tolerable threshold. The process for selecting these coefficients will be discussed in more detail shortly.

Each column in the matrix C corresponds to a coefficient for weighting the data from a different respective one of the n information sectors $S_i$, i=1 ... n.

At step 230 the method computes each of the redundancy codes $r_j$ for a given j as the linear sum:

$$r = c_1 \cdot v_1 + c_2 \cdot v_2 + \ldots + c_n \cdot v_n \quad (2)$$

In other words:

$$r_1 = c_{1,1} \cdot v_1 + c_{1,2} \cdot v_2 + \ldots + c_{1,n} \cdot v_n$$

$$r_2 = c_{2,1} \cdot v_1 + c_{2,2} \cdot v_2 + \ldots + c_{2,n} \cdot v_n$$

$$r_k = c_{k,1} \cdot v_1 + c_{k,2} \cdot v_2 + \ldots + c_{k,n} \cdot v_n \quad (3)$$

or:

$$r_j = c_{j,1} \cdot v_1 + c_{j,2} \cdot v_2 + \ldots + c_{j,n} \cdot v_n \; j=1 \ldots k \quad (3a)$$

Each redundancy code $r_j$ is a sum of n terms, one term for each of the n information sectors $S_i$ in the group being encoded for. Each term is computed by taking a multiplicand from the respective information sector $S_i$, and multiplying by the respective coefficient $c_{j,i}$ for that information sector. As shown in the above, in embodiments the multiplicand of each term is the information payload $v_i$ only. The error detection codes $z_i$ (e.g. the checksum bytes) may be ignored in the construction of the redundancy codes and the recovery; these are used to check for the presence of errors in the sector, but not used in the cross-sector redundancy codes $r_j$ codes described here. However in alternative embodiments, it is not excluded that additional data from the sector $S_i$, such as the respective error detection code $z_i$, could be included in the respective multiplicand of each term.

In embodiments, each information payload $v_i$ in the group may comprise and be processed as a vector of information values (elements), e.g. a vector of individual bits or bytes. Similarly each redundancy code $r_j$ may comprise and be processed as a vector of redundancy elements. Hence the information payloads and redundancy codes may be referred to as information vectors and redundancy vectors respectively. However it will be appreciated that this is not limiting, and in other variants of the below each of the information payloads $v_i$ and/or redundancy codes $r_j$ could be treated as a single scalar value.

In preferred embodiments, each of the information payloads $v_i$ and redundancy codes $r_j$ is a vector, each of the coefficients $c_{j,i}$ is a scalar.

Observe that the addition and multiplication operations above take place in a finite field. If for example the coefficients and codewords are composed of 2 bytes each (16 bits), an appropriate field for the operations is e.g. the Galois Field $GF(2^{16})$. Otherwise, the notation follows standard algebraic rules: the constants $c_1, c_2, \ldots, c_n$ are multiplied with each element of the corresponding vector $v_1, v_2, \ldots, v_n$; and also, the vector additions are element-wise.

Note also again that in general, k may be less than, equal to or greater than n, depending on implementation.

Since typically one would expect errors in multiple information vectors $v_i$ in a group, the method generates multiple redundancy vectors, $r_1, r_2, \ldots, r_k$ for a given group. As mentioned above, corresponding coefficients are denoted $c_{i,1}, c_{i,2}, \ldots, c_{i,n}$ for redundancy vector $r_j$, with j from 1 to k. The values of all $c_{j,i}$ are non-zero. Furthermore, the values of the different sets of coefficients $c_j = [c_{j,1}, c_{j,2}, \ldots, c_{j,n}]$ are linearly independent with respect to one another, where each set is the set of coefficients used for one of the redundancy codes $r_j$, i.e. one row of the matrix in equation (1), corresponding to one line of equation (3). So the set of coefficients $c_1 = [c_{1,1}, c_{1,2}, \ldots, c_{1,n}]$ used for in the redundancy code $r_j = 1$ is linearly independent of each of the other sets of coefficients $c_2 = [c_{2,1}, c_{2,2}, \ldots, c_{2,n}] \ldots c_k = [c_{k,1}, c_{k,2}, \ldots, c_{k,n}]$, and so forth (note that the vectors here are of different type of the vectors that encode user or redundancy data—here the vector $c_j$ denotes a set of coefficients, one for each of the information vectors $v_i = 1 \ldots n$).

"Linearly independent" means that one set cannot be created from a linear combination of the other sets. That is, for any given set $c_{j=a} = [c_{a,1}, c_{a,2}, \ldots, c_{a,n}]$ in use for a given group of information sectors (i.e. amongst the sets of coefficients used in equation 3), there exists no set of scalar factors $\beta$ such that $c_{j=a} = (\beta_1 \cdot c_1) + \ldots + (\beta_{a-1} \cdot c_{a-1}) + (\beta_{a+1} \cdot c_{a+1}) + \ldots + (\beta_k \cdot c_k)$, where $c_j$ denotes $[c_{j,1}, c_{j,2}, \ldots, c_{j,n}]$. This condition is equivalent to saying that each set of coefficients adds a new piece of redundant information to the redundancy codes. If this condition is not met for one of the sets of coefficients, then the corresponding redundancy code generated from that set coefficients adds no new redundant information to the codes, and thus one fewer of the information payloads $v_i$ can be corrected for than there are redundancy codes.

Assuming the linear independence condition is met, then the k redundancy vectors can be used to recover the user information $v_i$ from any k missing user sectors $S_i$. Similarly, if there are k'<k missing user sectors, any k' redundancy vectors can be used to reconstruct the missing user sectors (with the help of the n−k' user sectors that have been read error-free). The condition that the coefficient sets $c_j$ are linearly independent is equivalent to the matrix of equation (1) having row rank k.

To achieve the linear independence, the coefficients of the sets may be selected according to a pseudorandom process. This does not in itself strictly ensure linear independence. However, it would mean that there is within some threshold probability of the sets being linearly independent. In some embodiments the method may simply comprise selecting the sets of coefficients pseudorandomly and not checking the linear independence condition, on the assumption that the sets will probably be linearly independent within a tolerable threshold probability, and if they turn out not to be, the consequence is tolerable (i.e. that one fewer erroneous information sector $S_i$ amongst the group of n sectors can be corrected for). In other words simply generate the coefficients randomly and hope for the best. Alternatively however, the sets of coefficients may be selected using a selection process that ensures the sets are linearly independent. For example, this may comprise selecting them pseudorandomly, then checking the selected sets are linearly independent, and if not re-selecting one, some or all of the coefficients using the pseudorandom number generator until the linear independence condition is met. Another possibility is to use predesigned sets of coefficients.

At step 240 the information sectors $S_i$ are written to the storage medium. The redundancy sector(s) R may also be written to the medium, and in embodiments this may also include the coefficients or a seed of the process used to generate the coefficients (see below). Alternatively some or all of this redundancy data could be communicated to the reading computer separately. Also, it will be appreciated that FIG. 2 is given only by way of example, and in other variants of the method the information sectors $S_i$ could be written to the storage medium before step 220 or 230. The order of the steps is not important except to the extent that there is a dependency in the information being generated.

Referring, again to FIG. 1 and equation (3), note that the encoding scheme for encoding the redundancy codes $r_j$ is a systematic encoding scheme. That is, it leaves the payload information $v_i$ itself untransformed, and the redundancy information $r_j$ is separate to the payload information $v_i$. In contrast in a non-systematic encoding scheme such as has been used previously in network coding, as disclosed in U.S. Pat. No. 7,756,051, the encoding mathematically transforms the payload itself. In other words the redundancy is spread out across the whole information sector or packet. In the non-systematic case as used previously in network coding, everything received at the receive side is encoded, and the decoding is required to read every packet. Whereas in the systematic case used for storage as disclosed herein, decoding is only needed for erroneous sectors, and the computational overhead scales with the number of sectors that are lost.

In the systematic case, the information payload $v_i$ could be the user data in-the-clear or could have been transformed by some lower layer of encoding (such as for media compression and/or encryption), but either way, it is untransformed by the encoding method or scheme at the layer that adds the redundancy coding, i.e. that generates said redundancy codes/vectors. And the redundancy codes are not stored in the same or overlapping physical storage elements of the medium as the payloads (e.g. they are separate voxels).

Note however that the scope of the present disclosure is not limited to the systematic case. In alternative embodiments, it is not excluded that the non-systematic case could also be used for storage. In the non-systematic case, this means that only redundancy codes would be stored on the storage medium, and no "raw" information sectors would be stored on the medium. In this case the information sectors will be recovered entirely from the codes, as long as at least n codes are read correctly.

In either the systematic or non-systematic case, increasing the number k of redundancy vectors $r_{j=1 \ldots k}$, increases the probability of successful recovery of user data (information sectors). However, it also increases the computational costs (for creating the redundancy vectors). The choice of k is a parameter of the system that may be specified at design time.

Given choices of the number of information sectors per group (n) and number of redundancy vectors (k), it is desired to pick appropriate values of $c_{i,j}$ that guarantee (or within a tolerable probability) that the sets of coefficients $c_j$ are linearly independent.

A mechanism will also be required to communicate the codes $r_j$ and the coefficients $c_{j,i}$ to the reading computer that is going to perform the decoding. One way is to fix the coefficient values and make them known to the process that generates the redundant vectors, and to the process that recovers the missing vectors. This approach would require fixing n·k coefficients, effectively requiring large space to store those values.

An alternative is to store the coefficients on the storage medium with the redundancy vectors, e.g. in the redundancy sector(s) R. In this approach, some space is reserved in the redundancy sector that corresponds to redundancy vector $c_j$ to store the values $c_{j,1}, c_{i,2}, \ldots, c_{k,n}$. This would require extra overhead per vector.

A third alternative is to design a deterministic process that generates the coefficients and has a short description. One implementation is to use a well-known algorithm for generating pseudo-random numbers. In this approach, the designer will fix the algorithm and the initial seed that generates the pseudo-random numbers sequence (and, hence, the coefficients). The designer would preferably check that the random numbers generated satisfy the linear independency assumption, e.g. by checking that the first n·k codewords define a matrix that has the form of (1) and that this matrix has row rank k. This check need only be done once per seed. In this approach, extra information does not need to be stored in each sector. However, it would be required to be able to map physical locations to specific sectors. I.e. to be able to identify the location of each information or redundancy sector on the glass. For each sector read, the decoding method on the reading computer would need to be able to derive the group where this sector belongs, and whether the sector is the i-th information sector or the i-th redundancy sector. This is possible by fixing locations in the medium to groups and sectors.

In further variants of any of the above, the redundancy codes, coefficients and/or seed (or other such indicator of a deterministic process) could be communicated to the reading computer via a separate medium, e.g. on an accompanying dongle or over a network communication channel.

Another remark relates to the error detection codes (e.g. checksums) $z_i$ that are added to each sector. In embodiments sectors contain either information and redundancy codewords, and additional information $z_i$ that can be used to detect errors in the sector. In such embodiments these checksums are preferably not used to create the redundancy codes. In some such embodiments, instead, first the bytes of the redundancy sectors R are computed, and then those may be used to compute the checksum(s) for the corresponding redundancy sector (s).

Figure 3:
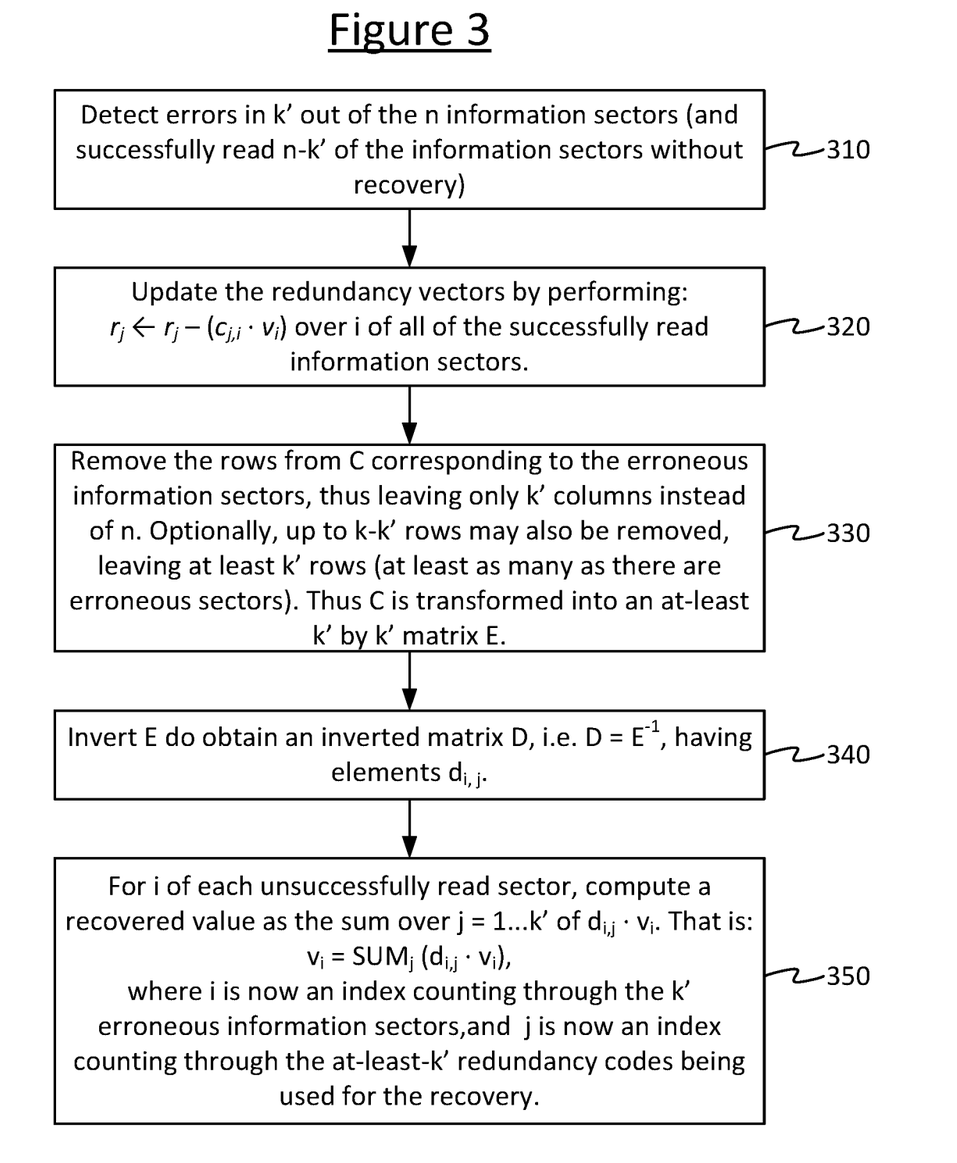
FIG. 3 is a flow chart of a method of reading data from a medium including recovery based on the redundancy data, and FIG. 4 schematically illustrates a scheme with both rows and columns of redundancy data.

FIG. 3 shows a decoding method that may be applied at a storing computer, for reading the data from the medium described in relation to FIG. 1 including recovering erroneous sectors using the redundancy codes $r_j$. The method is performed by software stored in memory and run on at least one processor of the reading computer. The memory may comprise one or more memory units, which could for example comprise any of the types of medium discussed above in relation to the storage medium on which the information sectors $S_i$ are stored, and/or different types, e.g. RAM (random access memory), etc.; and which could be the same or separate units than said storage medium, or a combination thereof.

At step 310, the method begins with a process of reading sectors from the storage medium (e.g. glass). After reading a sector $S_i$ (or indeed R), the method uses the respective error detection code $z_i$ (e.g. checksum) to determine whether the sector is error-free. The process also knows the group which the sector belongs to, as well as the location of the sector in the group (whether it is the i-th information or redundancy sector). Alternatively or additionally, an error could be detected upon complete read failure of a sector. In the case of error detection using the code $z_i$, clear purported values are successfully read from each bit or symbol of the sector, but it is detected based on the redundant information in the respective error detection code $z_i$ that at least one of those values is incorrect; whereas in the case of read failure no clear value can be read from at least one of the bits or symbols in the sector.

Either way, assume that after reading, the method failed to read correctly k'<k information sectors $S_i$ (of a group i=1 . . . n), and that it has successfully at least read k' redundancy codes (hence n−k' information sectors $S_i$ have been read correctly). The recovery process then works as follows.

At step 320, the method subtracts the correct information sectors from each of the redundancy codes. Assume that information vector $v_j$ has been read correctly for n−k' values of i. This means the method updates each redundancy vector $r_j$, as follows:

$$r_j \leftarrow r_j - c_{j,i} \cdot v_i \qquad (4)$$

where j now indexes amongst the k' redundancy codes $r_j$ being used in the recovery. For convenience of notation this may be denoted j=1 . . . k'. It will be appreciated that this is again just a convenient mathematical notation, and does not limit the form taken by the actual digital parameter used to reference the codes on the reading computer. Also strictly this is not necessarily the same sequence of j values as used to count through the k redundancy codes during encoding. As a matter of notation the new index could alternatively be labelled j', but the simpler j notation is adopted in the following. Either way the notation is not intended to imply that the k' redundancy codes used in decoding are the first (lowest) k' index codes in the sequence of k redundancy codes as indexed during encoding (it could be any k' of them, not necessarily the first k' in the sequence as indexed during encoding).

From this point on in the description, $r_j$ refers to the updated redundancy codes following step 320, and j refers to the index that indexes amongst the k' updated redundancy codes $r_j$ being used in the recovery.

At step 330, the method updates the matrix of equation (1) by removing the columns that correspond to the correct information sectors $S_i$ (those determined as correctly read at step 310). In doing so, the matrix (1) transforms into a k'×k' matrix. This reduced matrix may be labelled here as E. In the process of the reduction the mappings of the indices of the original blocks are also stored to the updated indices.

At step 340 the method inverts this reduced matrix in order to produce $D=E^{-1}$. An inverse matrix $E^{-1}$ is a matrix such that $E \cdot E^{-1} = 1$.

At step 350, the method recovers the missing information sectors by performing the following operation:

$$v_i = \sum_{j=1 \ldots k'} (d_{i,j} \cdot r'_j)$$

where this is the sum over all j of the k' redundancy codes being used in the recovery, for the $i^{th}$ erroneous sector $S_i$. The sum is individually performed for i of each of the incorrect or unsuccessfully read information sectors $S_i$ determined as being erroneous at step 310.

Finally, the $v_i$'s are remapped to the proper missing sectors using the map from step 330 above.

The values of the redundancy codes $r_j$ and coefficients $c_{j,i}$ used in the above decoding method may have been communicated to the process on the reading computer by any of the previously discussed means; either by being included on the storage medium itself (e.g. on one or more redundancy sectors R) along with the information sectors $S_i$, or communicated via a separate medium, or a combination of these approaches.

Note that the above has been described for the systematic case, where the n information sectors themselves are stored on the storage medium, and the recovery is performed only for the minimum necessary to recover the lost or erroneous information sectors (i.e. the number of recovery codes k' used in the recovery is equal to the number of information sectors to be recovered). The codes which are both present and non-erroneous are simply read directly from the medium. However, in principle the method could be used for any k'×k' matrix where k' is the number of redundancy codes used in the decoding, also equal to the number of information sectors desired to be read by the decoding method. At the extreme end of this, the method can even be applied to the non-systematic case where only redundancy codes (no information sectors) are stored on the medium, and all the desired information sectors are recovered from the codes. In this case there is no step 320 (equation 4) of updating the codes based on the correctly read information sectors, and the information vectors $v_i$ are recovered entirely from k' redundancy codes, where in this case k' is simply the number of information vectors to be recovered rather than the number that are missing or erroneous, and $r_j$ used in the decoding are simply the j= . . . k' codes used in the decoding.

There are a couple of parameters to consider in the encoding scheme which will affect the decoding.

One is the ratio of k (the number of redundancy codes provided) to n (the number of information sectors being encoded for). This will have an effect on the chance of constructing valid encodings in the case where the coefficients are selected pseudorandomly without actively ensuring that they are linearly independent.

In any computer a given value has to be represented in a finite field (also called a Galois field) of some size L, and in embodiments addition is performed in a wrap-around (modulo) fashion within that field. E.g. if the field size L is 8 bits, then after 255, adding 1 wraps back around to 0.

Let n be the number of information blocks. When a new code is constructed, a random number $c_i$ is chosen to combine with $v_i$ (see also equation 2). The number $c_i$ can be any number in the field excluding zero. So, there are $L=2^{16}-1$ ways to pick $c_i$. There are $L^n$ ways to pick then values of $c_i$.

If there are already k (<n) encodings chosen, the following gives the probability that a randomly generated encoding (as above) is dependent on the existing encodings (i.e. the new encoding is not good, in that it does not have the linear independence property).

The existing encodings can generate (i.e. span) $(L+1)^k$ encodings. This is because the existing encodings $r_1, r_2, \ldots, r_k$ can be linearly combined as $d_1 \cdot r_1 + \ldots + d_k \cdot r_k$ for random coefficients $d_1, \ldots, d_k$ from the field. Since the values of $d_i$ can take the zero value, the combinations of the linear encodings are $(L+1)^k$.

Hence, the probability that a randomly generated coefficient vector (i.e. code) is one of those spanned by the existing encodings is: $(L+1/L^n \approx L^{k-n} = 1/(2^{16}-1)^{n-k}$. As k approaches n, the probability of a bad choice increases. However, in embodiments k may be less than 10%-20% of n, and n may be many thousands. Hence, the probability of a bad choice is very small.

Note: unlike other redundancy coding and decoding schemes used for storage, n is not limited by the size L of the field in the present scheme. In other existing redundancy schemes n+k is limited to being smaller than L. However in the present scheme n+k can be greater than L. The number of encodings that can be generated is limited by n. The random construction of codes works better for larger fields (see the denominator in the formula above), but still the effect of n is more significant.

Another parameter to consider is the group size. Particularly, there is a benefit of using a larger group size (larger n) in that it improves the chance of recovery.

In a group with n information sectors and k associated redundancy codes, there will be a maximum number of errors that can be tolerated (at least n of the n information sectors and k codes will need to be successfully read). E.g. if there are 8 information sectors and 2 associated redundancy codes, then the system could tolerate up to 2 errors within the 10 sectors comprising the 8 information sectors and 2 redundancy sectors, and still recover the whole group. I.e. the total number of successfully read information sectors and codes is at least the number n of information sectors that were originally written to the medium in the group.

However the errors in the information sectors stored on the storage medium are random. With a finite group size, there is always a chance of being unlucky such that more erroneous sectors than the number of redundancy codes is designed for. With small group size this chance can be quite significant. E.g. in the example above, the statistical fluctuation in the number and distribution of errors could easily be such that a given group happened to have 3 erroneous information sectors, or more, and hence could not be recovered. The larger the group size, the smaller the chance of being unluckier than planned. I.e. as n tends towards infinity, the more the probability of the group being unrecoverable tends towards the theoretical statistical value for a given number of associated redundancy codes.

Assume again that n is the number of information blocks per group, and that k redundancy blocks are generated per group. Also, assume that p is the probability of reading an (information or encoding) block correctly. On average, one would expect that $(1-p)\cdot(n+k)$ will fail. As long as the number of failed blocks is less than k, then (by the linear independence assumption in the constructions of encoded blocks), it should be possible to reconstruct the missing blocks. If more than k failures are observed, then the decoder will fail to recover the at least one block of the group.

The probability of failure is $P_{fail} \leq \exp[-(n+k)\cdot D(n/(n+k)\|p)]$, with $D[a\|p]=a\cdot\log(a/p)+(1-a)\cdot\log((1-a)/(1-p))$. (This can be derived from the tail bounds of the Binomial distribution, and assumes that $k/n>1-p$; the $D(a\|p)$ function is the relative entropy.) Observe that the failure probability drops exponentially with the group size n. Hence, bigger n is much better.

However, there is also the $D(\bullet\|\supseteq)$ term. This mandates that for reasonable amounts of overhead compared to the expected failure probability $(1-p)$, n should be in the order of many thousands to guarantee very low failure probabilities. In storage, it is desirable to have very low failure probabilities ($P_{fail}$ should be $10^{-x}$, for an x as large as possible), because failure to retrieve data is practically unacceptable. Hence, very large groups sizes may be desirable in embodiments.

In some embodiments, the group size may even be all the information sectors on the whole. In some embodiments the group could span multiple pieces of writeable material (e.g. multiple pieces of glass).

A further optional optimization is now discussed with reference to FIG. 4. This provides a scheme of relatively small groups for faster recovery and/or incremental usage of the scheme.

The recovery process outlined above applies to an entire group of sectors $S_i$ (i=1 . . . n). This means that to recover a sector, the method enables recovery of the data if any n sectors are read successfully out of the total of n data sectors and k redundant sectors (or more generally any n information vectors and/or redundancy codes are read successfully out of the n information vectors and k redundancy codes). This approach works best when the goal of the reading process is to recover the entire content stored in the storage medium (e.g. the glass). This may be acceptable for applications such as archive storage where reading is only required occasionally and a slow recovery time is acceptable. However, in some scenarios it may be desired to read correctly only a subset of the data, and to do so more quickly.

Figure 4:
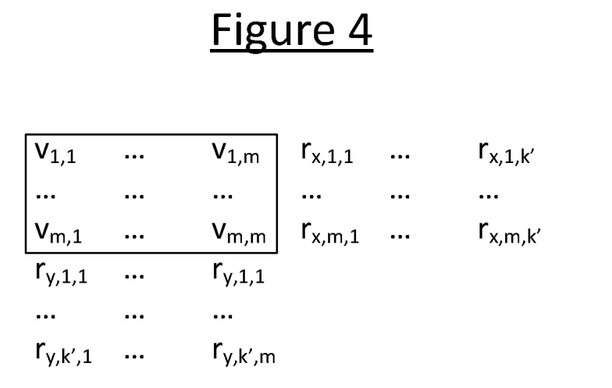

To reduce the effort of recovering a subset of the sectors, the information sectors may be organized into a matrix form as shown by way of example in FIG. 4 (the information sectors are indicated by the box). Redundancy sectors are computed per row (redundancy sectors $r_{x,i,j}$) and per column (redundancy sectors $r_{y,i,j}$). For example, $r_{x,1,1}$ to $r_{x,1,k'}$ may be constructed using as inputs $v_{1,1}$ to $v_{1,n}$ and the same methodology as before; and similarly, for $r_{y,1,1}$ to $r_{y,k',1}$ inputs $v_{1,1}$, $v_{2,1}$, . . . , $v_{n,1}$ are used. In the example illustrated there are m rows and m columns (a square matrix), but note that more generally there could be different numbers of rows than columns.

The use of smaller groups allows for faster recovery. It also allows for incremental usage of the scheme in encoding. For example, one could write a column at a time with its redundancy, and much later after many columns were written one could also then write the row redundancy to provide additional redundant protection. The row redundancy could even be chosen based on the error rates actually observed on the earlier columns.

To recover information vector vii we can use redundancy vectors from either row i or column j. Observe that the number of information vectors above is $m\cdot m=m^2$, and the number of redundancy vectors is $2\cdot m\cdot k'$.

Before detailing the process of recovering a sector for such embodiments, a few observations are made.

To compare this approach with the base scheme of the previous section (FIGS. 1 to 3), consider the case of $n=m^2$ or $m=\sqrt{n}$. The base scheme would require effort of reading between n and n+k sectors to recover a missing sector; the scheme of this section could recover using the row- or column-redundant sectors with effort in the order of $\sqrt{n}+k'$.

The example described in relation to FIG. 4 uses a square m×m matrix: the number of rows equals to the number of columns (m). It assumed the same number of redundant sectors for rows and columns (k'). An alternative implementation can use different dimensions in the rows and columns, and can also adjust the number of redundant sectors per row or column appropriately, depending on the size of the row or column, and other parameters of the system.

In the above linear coding was used to construct both the row- and column-redundant vectors. One could have used other methods to construct either the row redundant sector, or the column (or, indeed both). I.e. to recover missing blocks from rows or from columns, one could use linear codes on both, or on could use linear codes to recover missing blocks per row and a different redundancy coding scheme to recover blocks per column, or vice versa.

In the arrangement of FIG. 4, the process of reading a sector is as follows. First, try to read it directly. If that succeeds, then stop. The cost of reading is the cost of reading one sector. If it fails, then try to recover from the row (or, the column). The cost in terms of sectors read is then between m+1 and m+k (depending on how many sectors are in error). If that also fails, then try to recover using the column redundancy (or, row redundancy). This will add another cost which is between m+1 and m+k sector reads.

In the case that recovery using the row- and column-redundancy fails, the recovery continues in an iterative process. Observe that recovery failed both using row and column redundancy, hence, there are multiple sectors in error. Make a list of the missing sectors, and pick one of those sectors, say $v_{i,j'}$ and try to recover it using information in column j' (observe that $v_{i,j'}$ is in the same row as target sector $v_{i,j}$). j' refers to the column which contains sector $v_{i,j'}$ (where $v_{i,j'}$ is missing). If that succeeds, then try to recover the original sector $v_{i,j}$, or repeat with another missing sector. If it is not possible to recover $v_{i,j'}$, then add all missing sectors from column j' to the list and repeat with another sector.

This process terminates once it has recovered enough sectors that will allow the recovery of $v_{i,j}$, or it has read all information sectors v and all redundancy sectors r and d, and it is still not possible to make any progress towards recovering $v_{i,j}$. In the latter case, the recovery fails.

Notice that the performance of the tabular arrangement is comparable to the baseline scheme of the previous section in the worst case, i.e. the process will need to read all $n=m^2$ sectors and all redundancy sectors. However, in the common case, an erroneous sector should be decoded after reading 2·($\sqrt{n}$+k') sectors.

As another optional optimization, in addition or independently of that described in relation to FIG. 4, information stores from different recovery encoding groups may be physically interleaved with one another on the storage medium (i.e. their actual physical locations are interleaved in space).

Imperfections in the writing and reading processes can result in errors in reading sectors correctly. Those errors can happen independently from each other, meaning that the failure probability of a sector is the same for all sectors and a failure in one sector does not change the probability of failure in any other (adjacent) sector. Errors can also be spatially correlated, for example when imperfections in reading or writing affect many "neighbouring" sectors, i.e. sectors that are close to each other in the physical space. The approaches discussed in relation to FIGS. 1 to 4 can deal with either mode of errors. However, the performance of decoding depends on the number of errors in a group: the cost of decoding increases with the number of erroneous sectors. Hence, it may be desirable to avoid situations where errors affect many sectors from the same group, and instead it may be preferable to spread those errors evenly among the various groups.

Correlated errors may be expected to affect sectors that are in physical proximity in the physical space of the material. To break those correlations, sectors may be interleaved from different groups, preferably maximizing the spatial distance of sectors from the same group. The exact layout depends on the physical properties of the medium.

The example of FIG. 4 has been described with groups arranged into rows and columns, but more generally the same principle can be applied with any arrangement of information sectors arranged into overlapping storage subsets (overlapping groups of information sectors). Redundancy codes are generated per subset (group), i.e. redundant codes can be used to recover information sectors of the same subset but are not directly usable to recover information sectors that are not part of the same subset. The subsets can have overlapping information sectors; for example, subset A may contain information sectors $s_2$, $s_3$, $s_7$, and $s_8$ and subset B may contain $s_1$, $s_2$, $s_3$, and $s_6$. The decoding process works iteratively by identifying subsets that can be recovered, and then using the (recovered) information sectors from these subsets to recover more subsets.

As an example, assume that redundancy code $r_A$ is generated for subset A, and similar for $r_B$ for subset B, and that information sectors $s_2$ and $s_6$ are lost (all other $s_i$'s, $r_A$, and $r_B$ are received correctly). Since there are two missing sectors from subset B, and only one redundancy sector for B, it is not possible to recover subset B. However, there are enough redundancy to recover $s_2$ using subset A. Then, it is possible to use the reconstructed $s_2$ to recover $s_6$ using subset B. Observe that it would also be possible to recover even when $s_2$ and $s_3$ are lost: even though neither subset can be used in isolation to recover, $r_A$ and $r_B$ can be simplified to depend only on $s_2$ and $s_3$ (using the same process as in equation 4) to rewrite $r_A$ and $r_B$ to depend only on $s_2$ and $s_3$, and then use those relationships to recover $s_2$ and $s_3$.

The motivation behind creating the subsets is to be able to recover missing information sectors using fewer sectors (i.e. locally). This accelerates the decoding phase, for example by decoding smaller groups and by taking advantage of the placement of sectors from the same subset in nearby locations in the storage medium. (The runtime benefit comes at the cost of losing some coding efficiency).

The case of the product code (i.e. when we divided information sectors in columns and rows) is a special case of the scheme above in which the subsets defined by columns (rows) do not share any information sectors, and every subset defined by a column has exactly one information sector shared with every subset defined by a row.

To improve reliability, some storage systems place replicas of the content in geographically separate sites (datacenters); for example, sites in different continents. Existing storage systems typically store identical copies of both information and redundancy sectors to those sites. As a further extension, the methods above may be used to store different sets of redundancy codes at each site. In other words, per-site unique redundancy codes are generated, for example by creating the coefficient matrix using per-site unique random seeds to generate the coefficients. In the case of severe errors on multiple sites, where the sectors read correctly in each site are not enough to recover the original content, redundancy codes can be combined from multiple sites, increasing the probability of successful recovery.

This scheme is equivalent to the following: assuming s sites, then s·k redundancy codes are generated, and k redundancy codes are assigned to each site. The storage overhead per site is the same as in the process described previously. However, the probability of successful recovery is equivalent to the case of using s·k redundancy codes, if combination of redundancy codes is allowed across sites.

It will be appreciated that the above embodiments have been described by way of example only.

More generally, according to one aspect disclosed herein, there is provided a computer-implemented method of reading from a storage medium in order to recover a group of information sectors, each information sector comprising a respective information payload; wherein the storage medium stores redundancy data comprising a plurality of separate redundancy codes for said group, each redundancy code being a linear sum of terms, each term in the sum being the information payload from a different respective one of the information sectors in said group weighted by a respective coefficient of a set of coefficients for the redundancy code; and wherein the method comprises, after the redundancy data has already been stored on the storage medium, performing a decoding process comprising:

identifying a set of k' information sectors from said group from which the respective information payloads are to be recovered based on the redundancy data;
selecting k' of the redundancy codes;
determining a square matrix E in which each matrix column comprises the respective coefficients of a different one of the k' information sectors, and each matrix row comprises the set of coefficients of a different one of the k' redundancy codes, or vice versa;
determining a matrix D being a matrix inverse of E; and
recovering the k' information payloads by computing: $v_i = \Sigma_j (d_{i,j} \cdot r_j)$, where $v_i$ is the information payload, i is an index denoting the respective information sector, and j is an index denoting each redundancy code $r_j$, and where $d_{i,j}$ are the matrix elements of the D, and $\Sigma_j$ is the sum over the k' redundancy codes, the computation being performed for i of each of the k' information sectors.

In embodiments, some or all of the information sectors are also stored on the storage medium. This is the systematic case. Alternatively the method could be used in a non-systematic case, in which case only the redundancy codes are stored on the medium and not the information sectors, and the information payloads are recovered entirely from the redundancy codes.

In embodiments, said identifying may comprise: identifying which of the group of the information sectors are missing or erroneous, not being present on the storage medium or having information payloads $v_i$ that contain errors, and identifying which are present and non-erroneous, being found present on the storage medium and having information payloads $v_i$ that do not contain errors, wherein the k' information sectors comprise the missing and/or erroneous information sectors of the group.

In embodiments, the k' information sectors may be only the missing and/or erroneous sectors of the group. Alternatively it is not excluded that k' could be greater than strictly necessary, e.g. up to the same number of codes k as are stored for said group on the storage medium, even if there are fewer than k missing and erroneous sectors. However this would be more computationally intensive than necessary for recovery.

In embodiments, the method may comprise: prior to said recovery, updating each of k' of the redundancy codes by performing $r_j \leftarrow r_j - (c_{j,i} \cdot v_i)$ over i of all non-erroneous information sectors in the group that are found stored on the storage medium, where $c_{j,i}$ is the coefficient corresponding to the $i^{th}$ information sector and $j^{th}$ redundancy code; wherein the redundancy codes $r_j$ used in said recovery are the updated redundancy codes.

In embodiments, the sets of coefficients may not be stored on the storage medium, and instead the method may comprise:
reading from the storage medium an indication of a predetermined deterministic process for determining the sets of coefficients, and based thereon using said process to determine the sets of coefficients, or
receiving the sets of coefficients via a separate medium, or
receiving via a separate medium an indication of a predetermined deterministic process for determining the sets of coefficients, and based thereon using said process to determine the sets of coefficients.

The separate medium could be another digital or computer-readable storage medium (e.g. a dongle), or a network (e.g. the Internet). As another alternative, the separate medium could even comprise another form of medium such as a paper or printed medium, or audibly. Either way, the receiving could comprise receiving the coefficients in a communication addressed or sent specifically to the reading computer, or alternatively via a publication. For instance the coefficients could be published online.

In embodiments, the sets of coefficients for the different redundancy codes may be linearly independent with respect to one another.

In embodiments, the method may comprise an initial stage of storing the redundancy codes on the storage medium prior to said decoding process.

In embodiments, the initial storing stage may comprise selecting the coefficients according to a process that ensures the sets of coefficients for the different redundancy codes are linearly independent with respect to one another.

In embodiments, the initial storing stage may comprise selecting the coefficients pseudorandomly.

In embodiments, said group of information sectors may be all the information sectors on the storage medium.

In alternative embodiments, said group of information sectors may be one of multiple groups of information sectors on the storage medium, and the method may be applied individually to each of said groups.

In some such embodiments, the information sectors from different ones of the groups may be physically interleaved on the storage medium.

In embodiments, said group of information sectors may be one of a first group of information sectors stored on the storage medium and a second group of information sectors stored on the storage medium overlapping with the first, including some but not all of the same information sectors, each of the first and second groups being associated with a respective set of redundancy codes. In such embodiments, the method may comprise: when the information payloads of all the information sectors in the first group cannot initially be recovered based on the respective set of redundancy codes associated with the first group, recovering the information payloads of the information sectors in the second group based on the respective set of redundancy codes associated with the second group, thus recovering at least one of the payloads of the information sectors overlapping with the first group; and subsequently recovering the first group based on the redundancy sectors associated with the first group and the at least one recovered information sector in the first group.

The other of the first and second groups of information sectors could be encoded according to the same redundancy scheme or a different redundancy scheme.

In an example application of the various techniques disclosed herein, said storage medium may comprise a quartz glass storage medium.

In embodiments, the storage medium may comprise multiple separate pieces of writeable material, wherein said information sectors and/or redundancy codes span the multiple pieces of writeable material.

For instance the storage medium could comprise multiple separate platters, or even multiple storage units housed in separate housings. In embodiments the separate pieces of material are of the same media type, but alternately it is not excluded that they could comprise different media types, such as glass and magnetic, etc.

Some or all of the information sectors may be replicated across each piece of material (a copy of the same information on each piece), or some of the information codes may be stored only on one piece whilst other of the information sectors are stored only on another piece. In the case where the redundancy codes are stored on the medium, then some or all of the redundancy codes may be replicated across each piece of material (a copy of the same code on each piece), or some of the information codes may be stored on one piece whilst other of the information sectors are stored on another piece.

In some embodiments, the pieces of material could even be distributed across multiple different data centres at multiple different geographic sites.

Each information sector may further comprise a respective error detection code. In embodiments said multiplicand may be only the respective information payload and not the respective error detection code. Alternatively it is not excluded that said multiplicand comprises both the respective information payload and the respective error detection code.

The error may be an error that occurred in the storage of the one or more information payloads on the storage medium at write time, or an error that occurred due to deterioration after writing but before being read. The error may be detected at read time based on the error detection codes. Once detected, the error can be recovered based on the redundancy codes.

In embodiments each of said information payloads is a vector of information elements, each of said coefficients is scalar, and said multiplication comprises an element-wise multiplication of the respective scalar coefficient for the respective information payload with each information element of the respective information payload.

In embodiments the sets of coefficients may be selected according to a process that ensures the sets are linearly independent with respect to one another. Alternatively the coefficients may be selected according to a pseudorandom process (thus inherently having some likelihood of the sets being linearly independent with respect to one another).

In embodiments the storage medium may be a glass-based storage medium such as a quartz glass storage medium. Alternatively the storage medium could be another form of optical storage medium such as an optical disc, or a magnetic storage medium such as a magnetic disk or magnetic tape, or an electronic storage medium such as EEPROM or flash memory.

In embodiments the storage medium may be a write once, read many (WORM) storage medium.

In embodiments the method may be used for archive storage.

In embodiments the information payload may comprise comprises user data in the clear. Alternatively the information payload may be encoded by a lower-layer encoding scheme.

In embodiments the redundancy codes may be stored on the storage medium, e.g. in one or more redundancy sectors separate to the information sectors. Alternatively the redundancy codes need not be stored on the medium.

E.g. this could comprise publishing the codes or the indication of the predetermined process, or communicating them/it to a specified one or more parties via a communication channel separate form said storage medium. The predetermined process may for example comprise a deterministic pseudorandom process and said indication may comprise at least a seed of the pseudorandom process.

The information sectors of the group could be interleaved with those of one or more other groups. Alternatively the information sectors of said group may be physically contiguous on the storage medium.

The detection of the errors may be based on the respective error detection codes.

The method may also comprises reading the non-erroneous payload values directly without the need for recovery.

In embodiments, each of the elements of the inverted matrix D is a scalar, and each of the redundancy codes is a vector. The product "·" in $v_i = \Sigma_j(d_{i,j} \cdot r_j')$ may be an element-wise multiplication.

According to another aspect disclosed herein, there is provided a computer program embodied on computer-readable storage and comprising code configured so as when run on one or more processing units to perform the method of any embodiment disclosed herein.

According to another aspect, there is provided a computer system comprising memory comprising one or more memory units and processing apparatus comprising one or more processing units, the memory storing code arranged to run on the processing apparatus, wherein the code is configured to perform a method in accordance with any embodiment disclosed herein.

Other variants or use cases of the disclosed techniques may become apparent to the person skilled in the art once given the disclosure herein. The scope of the disclosure is not limited by the described embodiments but only by the accompanying claims.

The invention claimed is:

1. A computer-implemented method of reading from a memory device to recover a group of information sectors, each information sector comprising a respective information payload;
    wherein the memory device stores redundancy data comprising separate redundancy codes for said group, each redundancy code being a linear sum of terms, each term in the sum being the information payload from a different respective one of the information sectors in said group weighted by a respective coefficient from pseudorandom coefficients for the redundancy code; and
    wherein the method comprises performing a decoding process comprising:
    identifying k' information sectors from said group;
    selecting k' of the redundancy codes;
    determining a square matrix E in which each matrix column comprises the respective coefficients of a different one of the k' information sectors, and each matrix row comprises the coefficients of a different one of the k' redundancy codes, or vice versa;
    determining a matrix D being a matrix inverse of E; and
    recovering k' information payloads by computing: $v_i = \Sigma_j (d_{i,j} \cdot r_j)$, where $v_i$ is the information payload, i is an index denoting the respective information sector, and j is an index denoting each redundancy code $r_j$, and where $d_{i,j}$ are matrix elements of the D, and $\Sigma_j$ is a sum over the k' redundancy codes, the computation being performed for i of each of the k' information sectors.

2. The method of claim 1, wherein some or all of the information sectors are also stored on the memory device.

3. The method of claim 2, wherein identifying the k' information sectors comprises:
    identifying which of the group of the information sectors are missing or erroneous, not being present on the memory device or having information payloads $v_i$ that contain errors, and identifying which are present and non-erroneous, being found present on the memory device and having information payloads $v_i$ that do not contain errors, wherein the k' information sectors comprise the missing and/or erroneous information sectors of the group.

4. The method of claim 3, wherein the k' information sectors are only the missing and/or erroneous sectors of the group.

5. The method of claim 3, comprising:
prior to said recovery, updating each of k' of the redundancy codes by performing $r_j \leftarrow r_j - (c_{j,i} \cdot v_i)$ over i of all non-erroneous information sectors in the group that are found stored on the memory device, where $c_{j,i}$ is the coefficient corresponding to $i^{th}$ information sector and $j^{th}$ redundancy code; and
wherein the redundancy codes $r_j$ used in said recovery are updated redundancy codes.

6. The method of claim 1, wherein the pseudorandom coefficients are not stored on the memory device, and instead the method comprises:
reading from the memory device an indication of a deterministic process for determining pseudorandom coefficients, and based thereon using said process to determine the pseudorandom coefficients, or
receiving the pseudorandom coefficients via a separate medium, or
receiving via a separate medium an indication of a deterministic process for determining the pseudorandom coefficients, and based thereon using said process to determine the pseudorandom coefficients.

7. The method of claim 1, wherein the pseudorandom coefficients for different redundancy codes are linearly independent with respect to one another.

8. The method of claim 1, comprising an initial stage of storing the redundancy codes on the memory device prior to said decoding process, wherein the initial storing stage comprises selecting the pseudorandom coefficients according to a process that ensures the pseudorandom coefficients for different redundancy codes are linearly independent with respect to one another.

9. The method of claim 1, comprising an initial stage of storing the redundancy codes on the memory device prior to said decoding process, wherein the initial storing stage comprises the selecting of the pseudorandom coefficients pseudorandomly according to a pseudorandom process.

10. The method of claim 1, wherein said group of information sectors is all the information sectors on the memory device.

11. The method of claim 1, wherein said group of information sectors is one of multiple groups of information sectors on the memory device, and the method is applied individually to each of said groups.

12. The method of claim 11, wherein the information sectors from different ones of the groups are physically interleaved on the memory device.

13. The method of claim 1, wherein said group of information sectors is one of a first group of information sectors stored on the memory device and a second group of information sectors stored on the memory device overlapping with the first, each of the first and second groups being associated with respective redundancy codes; wherein the method comprises:
when the information payloads of all the information sectors in the first group cannot initially be recovered based on the respective redundancy codes associated with the first group, recovering the information payloads of the information sectors in the second group based on the respective redundancy codes associated with the second group, thus recovering at least one of the payloads of the information sectors overlapping with the first group; and
subsequently recovering the first group based on the redundancy codes associated with the first group and the at least one recovered payload of the information sectors overlapping with the first group.

14. The method of claim 1, wherein the memory device comprises multiple separate pieces of writeable material, wherein information sectors and/or redundancy codes span the multiple pieces of writeable material.

15. A computer program embodied on a computer-readable memory and comprising code configured so as when run on a processing unit to perform a method of reading from a memory device to recover a group of information sectors, each information sector comprising a respective information payload;
wherein the memory device stores redundancy data comprising separate redundancy codes for said group, each redundancy code being a linear sum of terms, each term in the sum being the information payload from a different respective one of the information sectors in said group weighted by a respective coefficient from pseudorandom coefficients for the redundancy code; and
wherein the method comprises performing a decoding process comprising:
identifying k' information sectors from said group;
selecting k' of the redundancy codes;
determining a square matrix E in which each matrix column comprises the respective coefficients of a different one of the k' information sectors, and each matrix row comprises the coefficients of a different one of the k' redundancy codes, or vice versa;
determining a matrix D being a matrix inverse of E; and
recovering k' information payloads by computing: $v_i = \Sigma_j (d_{i,j} \cdot r_j)$, where $v_i$ is the information payload, i is an index denoting the respective information sector, and j is an index denoting each redundancy code $r_j$, and where $d_{i,j}$ are matrix elements of the D, and $\Sigma_j$ is a sum over the k' redundancy codes, the computation being performed for i of each of the k' information sectors.

16. A computer system comprising a memory and a processor, the memory storing code arranged to run on the processor, wherein the code is configured to perform a method of reading from a memory device to recover a group of information sectors, each information sector comprising a respective information payload;
wherein the memory device stores redundancy data comprising separate redundancy codes for said group, each redundancy code being a linear sum of terms, each term in the sum being the information payload from a different respective one of the information sectors in said group weighted by a respective coefficient from pseudorandom coefficients for the redundancy code; and
wherein the method comprises performing a decoding process comprising:
identifying k' information sectors from said group;
selecting k' of the redundancy codes;
determining a square matrix in which each matrix column comprises the respective coefficients of a different one of the k' information sectors, and each matrix row comprises the coefficients of a different one of the k' redundancy codes, or vice versa;
determining a matrix being a matrix inverse of the square matrix; and
recovering k' information payloads by computing a sum of elements from the matrix, over the k' redundancy codes, the computation being performed for i of each of the k' information sectors, where i is an index denoting the respective information sector.

17. The computer system of claim 16, wherein some or all of the information sectors are also stored on the memory device.

18. The computer system of claim 17, wherein identifying the k' information sectors comprises:
identifying which of the group of the information sectors are missing or erroneous, not being present on the memory device or having information payloads $v_i$ that contain errors, and identifying which are present and non-erroneous, being found present on the memory device and having information payloads $v_i$ that do not contain errors, wherein the k' information sectors comprise the missing and/or erroneous information sectors of the group.

19. The computer system of claim 18, wherein the k' information sectors are only the missing and/or erroneous sectors of the group.

20. The computer system of claim 18, comprising:
prior to said recovery, updating each of k' of the redundancy codes by performing $r_j \leftarrow r_j - (c_{j,i} \cdot v_i)$ over i of all non-erroneous information sectors in the group that are found stored on the memory device, where $c_{j,i}$ is the coefficient corresponding to $i^{th}$ information sector and $j^{th}$ redundancy code; and
wherein the redundancy codes $r_j$ used in said recovery are updated redundancy codes.

* * * * *